United States Patent [19]

Muroya

[11] Patent Number: 5,693,453
[45] Date of Patent: Dec. 2, 1997

[54] METHOD OF FORMING MICROPATTERN

[75] Inventor: Yoshiharu Muroya, Tokyo, Japan

[73] Assignee: NEC Corporation, Tokyo, Japan

[21] Appl. No.: 603,260

[22] Filed: Feb. 20, 1996

[30] Foreign Application Priority Data

Feb. 20, 1995 [JP] Japan .................. 7-030367

[51] Int. Cl.$^6$ .................................................. G03F 7/22
[52] U.S. Cl. ..................... 430/296; 430/942; 250/492.3
[58] Field of Search ............................ 430/296, 942; 250/492.3

[56] References Cited

U.S. PATENT DOCUMENTS

| 5,112,724 | 5/1992 | Bradshaw ...................... 430/942 X |
| 5,415,835 | 5/1995 | Brueck et al. ...................... 430/311 |
| 5,466,548 | 11/1995 | Matsui ........................... 430/1 |

FOREIGN PATENT DOCUMENTS

| 61-160929A | 7/1986 | Japan ................... 430/296 |
| 63-1032A | 1/1988 | Japan ................. 250/492.3 |

OTHER PUBLICATIONS

M. Suehiro et al.; "GaAs/AlGaAs First–Order Gratings Fabricated with Electron Beam Lithography and Very–Narrow–Linewidth Long–Cavity DBR Laser Diodes"; IEEE Journal of Quantum Electronics, vol. 29, No. 6, Jun. 1993, pp. 2081–2087.

T. Kjellberg et al.; "The Effect of Stitching Errors on the Spectral Characteristics of DFB Lasers Fabricated using Electron Beam Lithography"; Journal of Lightwave Technology, vol. 10, No. 9, Sep. 1992, pp. 1256–1266.

*Primary Examiner*—Cynthia Hamilton
*Attorney, Agent, or Firm*—Whitham, Curtis, Whitham & McGinn

[57] ABSTRACT

A method of forming a micro dot pattern by using an electron beam exposure apparatus which sets a minimum unit moving distance of an electron beam smaller than an electron beam diameter includes the steps of defining one of lattice points formed for every minimum unit moving distance of the electron beam as a reference position, and irradiating the electron beam on at least two lattice points within an area separated from the reference position by a distance smaller than the electron beam diameter in an equal exposure amount or different exposure amounts to form a pattern having a center at an exposure peak position in a sum of the plurality of exposure amounts, thereby forming the micro dot pattern having a center at a position other than the lattice points.

3 Claims, 14 Drawing Sheets

2000Å

2005Å

2010Å

2015Å

2020Å

2025Å

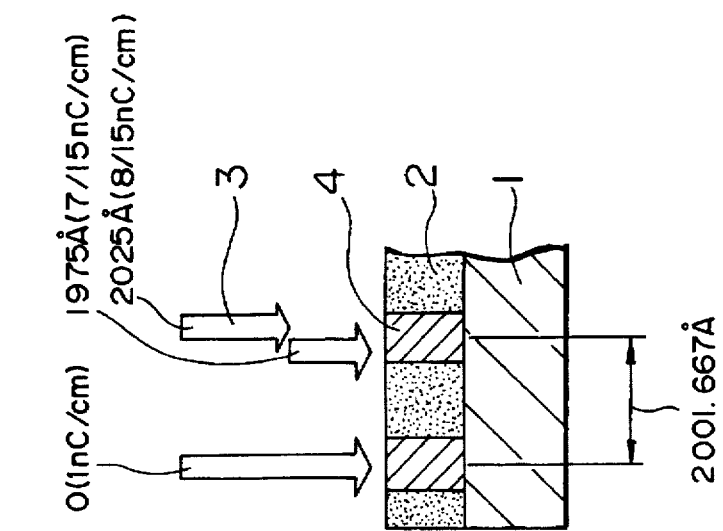
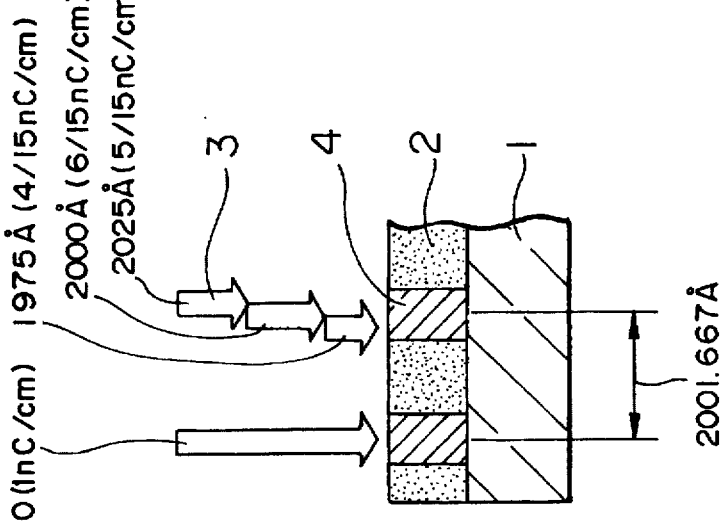
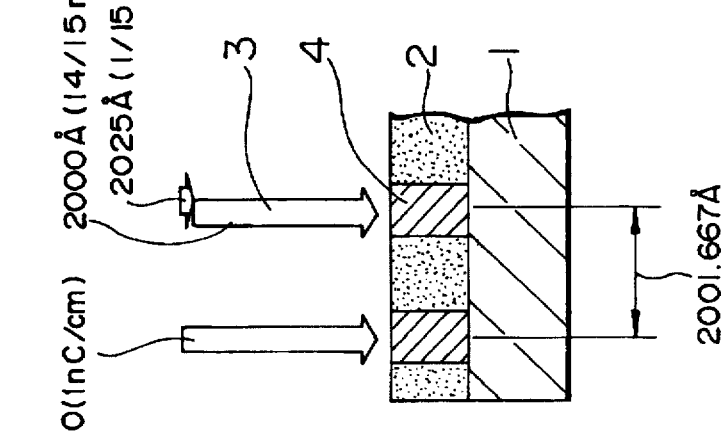

2005Å PITCH

2005Å PITCH

METHOD OF FORMING MICROPATTERN

BACKGROUND OF THE INVENTION

1. Field of the Invention

The present invention relates to a method of forming a micropattern and, more particularly, to a method of forming a micropattern, which uses an electron beam (EB) exposure method to form a micropattern such as a diffraction grating for a distributed feedback (DFB) laser.

2. Description of the Prior Art

To form a diffraction grating for a distributed feedback laser or the like by using the electron beam exposure method, a line pattern is formed by one electron beam scanning cycle, as shown in FIG. 1. A diffraction grating is formed by repeating this process. For this reason, the center of the formed pattern is limited to lattice points formed for every minimum unit moving distance of the electron beam of the electron beam exposure apparatus. Since the pitch (period) of the formed diffraction grating is also limited to an integer multiple of the minimum unit moving distance of the electron beam, the oscillating wavelength of the completed distributed feedback laser is limited accordingly.

In wavelength division multiplexing (WDM) which is regarded as an important technique for the optical communication system in the future, the light source requires an absolute wavelength accuracy of ±1 nm. To realize this accuracy, precision control of a grating pitch at about 0.1 nm (1 Å) is necessary.

To precisely control the diffraction grating pitch by using the electron beam exposure method, a technique is known in which the exposure field size of the electron beam exposure apparatus (an area where a pattern is formed by electron beam deflection without moving the exposure stage of the electron beam exposure apparatus) is adjusted, as described in, e.g., "Suehiro et al. Journal of Quantum Electronics vol. 29 No. 6 p. 2081 (1993)", because it is very complex and difficult to reduce the minimum unit moving distance of the electron beam of the electron beam exposure apparatus by precisely controlling the digital/analog converter in the apparatus. To form a grating having a pitch of 101 nm by this technique, data corresponding to a pitch of 100 nm is prepared, the exposure field is increased by 1% in correction of deflection amplitude of the electron beam deflector, and the moving amount of the exposure stage is increased by 1%, thereby forming a pitch of 101 nm.

However, with this conventional technique in which the exposure field size is adjusted in correction of electron beam deflection amplitude of the electron beam exposure apparatus to control the diffraction grating pitch, correction of a junction (stitching) error at the field boundary portion of the electron beam exposure apparatus is complex, resulting in an increase in junction error as compared to a normal exposure method.

When this diffraction grating is applied to a distributed feedback laser, the oscillation mode of the laser becomes unstable because of the junction error in the diffraction grating.

In addition, with the above technique of controlling the diffraction grating pitch, the field size must be adjusted every time the pitch of an area in a wafer changes. This makes the process complex and also makes it difficult to manufacture a pitch-modulated grating or the like.

SUMMARY OF THE INVENTION

The present invention has been made in consideration of the above situation in the prior art, and has as its object to provide a method of forming a micropattern, in which precision control of a diffraction grating pitch is performed such that a pattern having its center at a point other than a lattice point formed for every minimum unit moving distance of an electron beam of an exposure apparatus is formed, thereby manufacturing a distributed feedback laser with simple processes without degrading the accuracy of correction of a junction (stitching) error in the exposure field of the apparatus.

In order to achieve the above object, according to the first aspect of the present invention, there is provided a method of forming a micro dot pattern by using an electron beam exposure apparatus which sets a minimum unit moving distance of an electron beam smaller than an electron beam diameter, comprising the steps of defining one of lattice points formed for every minimum unit moving distance of the electron beam as a reference position, and irradiating the electron beam on at least two lattice points within an area separated from the reference position by a distance smaller than the electron beam diameter in an equal exposure amount or different exposure amounts to form a pattern having a center at an exposure peak position in a sum of the plurality of exposure amounts, thereby forming the micro dot pattern having a center at a position other than the lattice points.

According to the second aspect of the present invention, there is provided a method of forming a micropattern by using an electron beam exposure apparatus which sets a minimum unit moving distance of an electron beam smaller than an electron beam diameter, comprising the step of irradiating the electron beam on at least two straight lines or pseudo curves (a curve formed by combining straight lines) parallel to each other in areas separated from each other by a distance smaller than the electron beam and passing through lattice points formed for every minimum unit moving distance of the electron beam in an equal exposure amount or different exposure amounts, thereby forming a line or pseudo curve pattern having a center passing positions other than the lattice points.

According to the third aspect of the present invention, there is provided a method of forming a micropattern by using an electron beam exposure apparatus which sets a minimum unit distance of an electron beam smaller than an electron beam diameter, comprising the steps of forming a first line pattern on lattice points serving as a reference position when a central position D of a jth line pattern for forming a diffraction grating is represented as $D=D_{1j}d+D_{2j}d$ ($D_{1j}$ is a positive integer: $0 \leq D_{2j} < 1$), and sequentially exposing straight lines passing through lattice points separated from the reference position by distances $D_{1j}d$ and $(D_{1j}+1)d$ in exposure amounts $(1-D_{2j})$ and $D_{2j}$, respectively, to form a jth ($2 \leq j$) line pattern, thereby forming a diffraction grating pattern having a pitch independently of an integer multiple of the minimum unit moving distance d of the electron beam.

According to the present invention having the above aspects, precision control of a diffraction grating pitch independently of an integer multiple of the minimum unit moving distance of an electron beam of an electron beam exposure apparatus can be performed using the electron beam exposure apparatus with simple processes without degrading the accuracy of correction of a junction (stitching) error in the exposure field of the apparatus.

In addition, precision wavelength control of a distributed feedback laser can be performed so that a wavelength multiplexing laser array or the like can be manufactured with simple processes.

The above and many other advantages, features and additional objects of the present invention will become manifest to those versed in the art upon making reference to the following detailed description and accompanying drawings in which preferred embodiments incorporating the principles of the present invention are shown by way of illustrative example.

BRIEF DESCRIPTION OF THE DRAWINGS

FIGS. 14A to 14C are sectional views for explaining modifications of the fourth embodiment of the present invention;

DETAILED DESCRIPTION OF THE PREFERRED EMBODIMENTS

The principle of a method of forming a pattern having its center at a position other than a lattice point formed for every minimum unit moving distance of an electron beam by using an electron beam exposure method in a micropattern forming method of the present invention will be described first below with reference to FIGS. 2A to 2D.

Figure 2A:
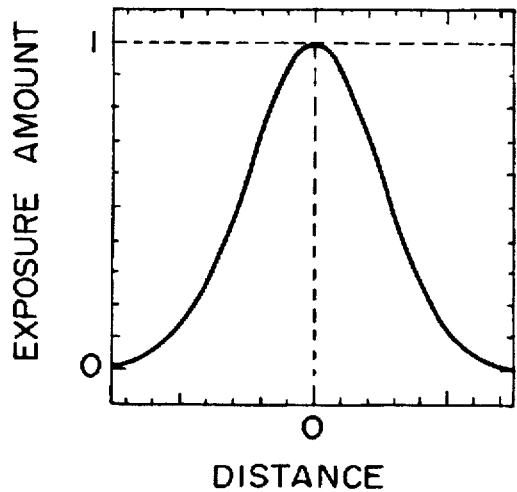
FIGS. 2A to 2D are graphs for explaining the principle of an exposure method of the present invention.

As shown in FIG. 2A, one point 0 of lattice points formed for every minimum unit moving distance of an electron beam is defined as a reference position. When an electron beam having, at the reference position, a distribution indicated by a solid line in FIG. 2A is irradiated in an optimum irradiation amount (e.g., 1.0), a pattern having its center at the reference position is formed. This process is the same as in the conventional exposure method.

Figure 2B:
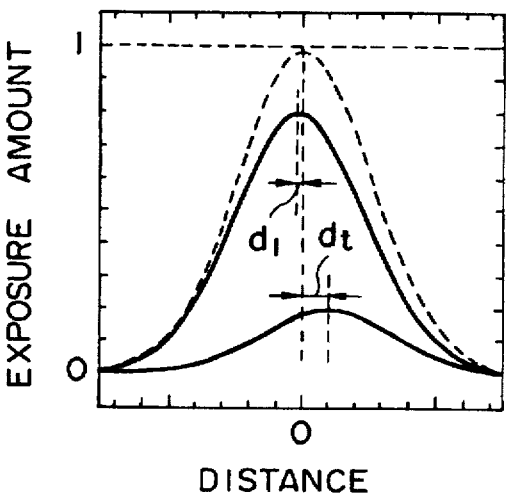

Subsequently, in the electron beam exposure method of the present invention, as shown in FIG. 2B, the reference position 0 and a lattice point separated from the reference position 0 by the minimum unit moving distance of the electron beam, or a distance $d_t$ corresponding to an integer multiple thereof are irradiated with electron beams having distributions indicated by solid lines in FIG. 2B in exposure amounts of 0.8 and 0.2, respectively. With this process, a pattern is formed in accordance with the sum (having a distribution indicated by a broken line) of the electron beams irradiated on the two portions. The pattern has its center at an exposure peak position $d_1$ in the distribution according to the sum.

Figure 2C:
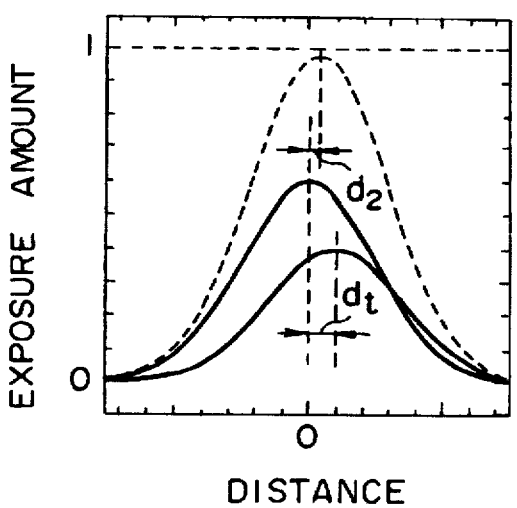
Figure 2D:
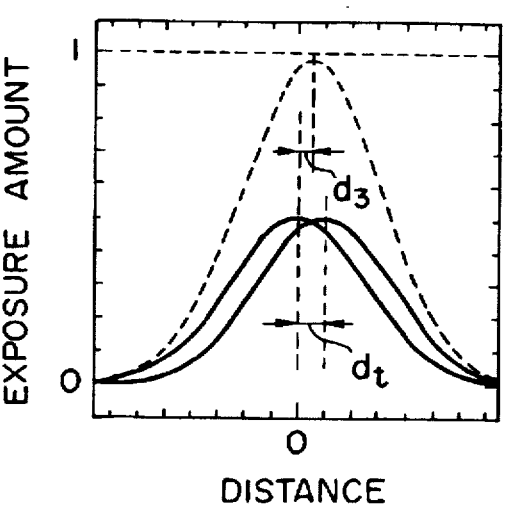

In FIG. 2C, the sum of electron beams irradiated on two lattice points separated from each other by the distance $d_t$ in exposure amounts of 0.6 and 0.4, respectively, is shown as a distribution indicated by a broken line. In FIG. 2D, similarly, the sum of electron beams irradiated on two lattice points separated from each other by the distance $d_t$ in an equal exposure amount of 0.5 is shown as a distribution indicated by a broken line. Each pattern has its center at an exposure peak position $d_2$ or $d_3$ in the distribution indicated by the broken line.

Figure 3:
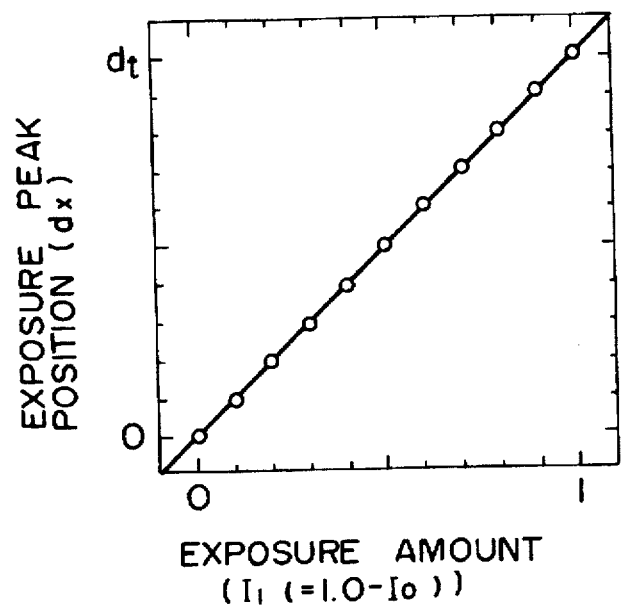
FIG. 3 is a graph showing the relationship between the exposure amount and the peak position of an electron beam in the exposure method of the present invention, which is observed when the minimum unit moving distance of the electron beam is sufficiently smaller than the electron beam diameter.

FIG. 3 is a graph showing the relationship between the electron beam exposure amount and the exposure peak position in the sum of the two electron beam distributions, which is obtained from the approximate expression of the Gaussian distribution of the electron beam in pattern formation using electron beams irradiated on the reference position and a lattice point separated by the distance $d_t$ in exposure amounts $I_0$ and $I_1$ (=1.0–$I_0$), respectively. When the distance $d_t$ between the two portions on which the electron beams are irradiated is sufficiently smaller than the electron beam diameter, a proportional relationship represented by an almost straight line is established between the exposure peak position and the exposure amount, as shown in this graph.

With the exposure method as shown in FIGS. 2B to 2D, a pattern having a precisely controlled center (exposure peak position) at a position other than a lattice point formed for every minimum unit moving distance of the electron beam of the exposure apparatus is formed.

In the present invention, this effect is used to form a line pattern passing through portions other than lattice points formed for every minimum unit moving distance of the electron beam, so that a diffraction grating pattern having a precisely controlled grating pitch can be formed.

Preferred embodiments of the present invention and modifications thereof will be described below.

FIGS. 4A to 4D are views for explaining different examples of the first embodiment of the present invention, showing a method of forming a pattern having its center at the exposure peak position other than a lattice point formed for every minimum unit moving distance of an electron beam by using an electron beam exposure apparatus which sets the minimum unit moving distance of an electron beam smaller than the electron beam diameter.

Figure 4A:
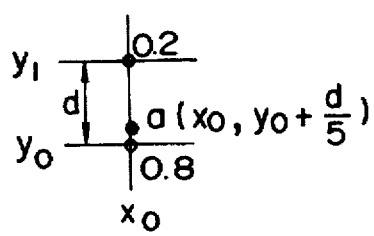
FIGS. 4A to 4D are views for explaining different examples of the first embodiment of the present invention.
Figure 4B:
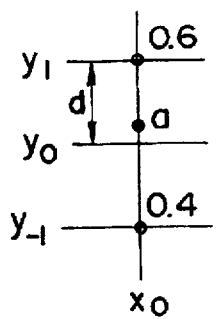

FIG. 4A shows a case in which a point $(X_0,y_0)$ indicated by ○ (white dot) on the stage of the exposure apparatus is irradiated with an electron beam in an exposure amount of 0.8, and a point $(x_0,y_1)$ indicated by ○ separated from the point $(x_0,y_0)$ by a minimum unit moving distance d of the electron beam or an integer multiple thereof is irradiated with an electron beam in an exposure amount of 0.2, where the exposure amount $I_0$ needed to form a pattern by irradiating an electron beam on one point is defined as 1.0. The central position of the exposed pattern is represented by a point a $(x_0,y_0+d/5)$ indicated by ● (black dot). In this manner, a dot pattern having its center at a point other than a lattice point is formed.

As described above, when N lattice points $(m_1d,n_1d)$, $(m_2d,n_2d)$ . . . . and $(m_Nd,n_Nd)$ ($m_i$ and $n_i$ are integers) in an area smaller than the electron beam are exposed at intensities $P_1I_0$, $P_2I_0$ . . . , and $P_NI_0$ $(P_1+P_2+ . . . +P_N=1.0)$, respectively, by using the electron beam exposure apparatus which sets the minimum unit moving distance of the electron beam smaller than the electron beam diameter, a dot pattern having its center at a coordinate position represented by equation (1) is formed:

$$\left\{ \left( \sum_{K=1}^{N} P_K m_K \right) d, \left( \sum_{K=1}^{N} P_K n_K \right) d \right\} \quad (1)$$

Figure 1:
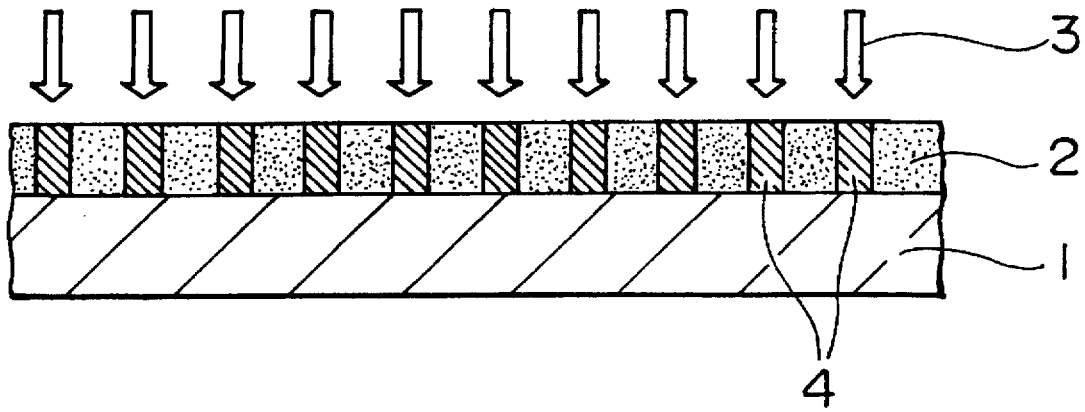
FIG. 1 is a sectional view for explaining a conventional exposure method of forming a diffraction grating.

FIGS. 4A to 4D show different examples of pattern formation using the above exposure method, in which the dot pattern a having its center at the same coordinate position as in FIG. 1A is formed.

Figure 5A:
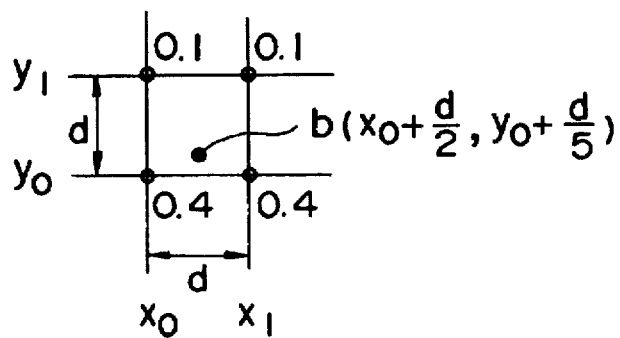
FIGS. 5A to 5C are views for explaining further different examples of the first embodiment of the present invention.
Figure 5B:
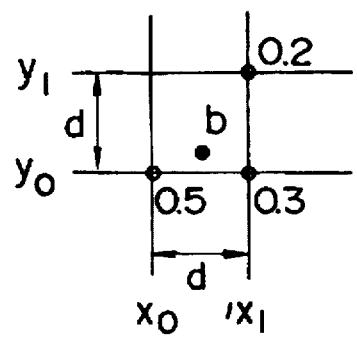
Figure 5C:
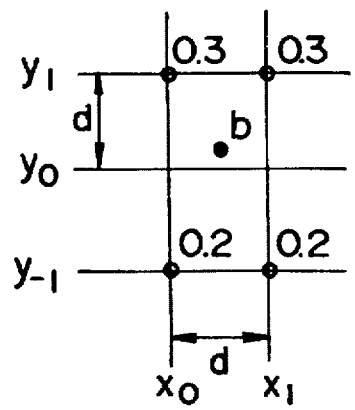

FIGS. 5A to 5C show a case in which a point indicated by ○ is exposed in an exposure amount shown in each figure by using the same method as in the above examples to form a dot pattern at a point b $(x_0+d/2,y_0+d/5)$ indicated by ●. In all of FIGS. 5A to 5C, the dot pattern b having its center at the same coordinate position is formed.

FIGS. 6A to 6D are graphs for explaining the principle of an exposure method according to the second embodiment of the present invention, showing a technique of correcting an exposure amount when a pattern having its center at a position other than a lattice point formed for every minimum unit moving distance of an electron beam is to be formed using an electron beam exposure apparatus which sets the minimum unit electron beam moving distance of an electron beam or a distance corresponding to an integer multiple thereof smaller than the electron beam diameter.

Figure 6A:
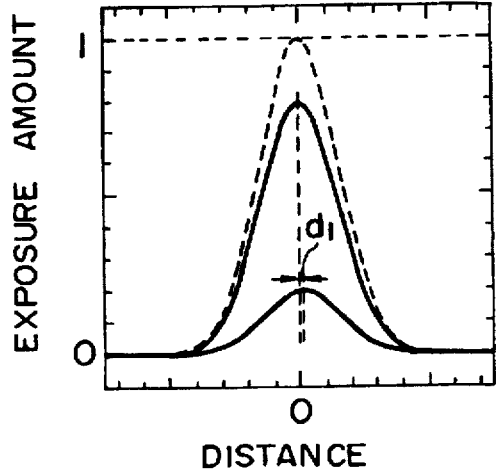
FIGS. 6A to 6D are graphs for explaining the principle of an exposure method according to the second embodiment of the present invention.

FIG. 6A shows a case in which the minimum unit moving distance of an electron beam or a distance $d_1$ corresponding to an integer multiple thereof is sufficiently smaller than the electron beam diameter. The sum (represented as a distribution indicated by a broken line) obtained from an approximate expression on the basis of the electron beam distributions indicated by two solid lines has almost the same distribution as in pattern formation by electron beam irradiation on only one point, which is shown in FIG. 6D. As for the exposure peak position in this case, the same value as that obtained by calculation using equation (1) is obtained. For this reason, the same pattern as in pattern formation by electron beam irradiation on one point can be formed without correcting the exposure amount.

Figure 6B:
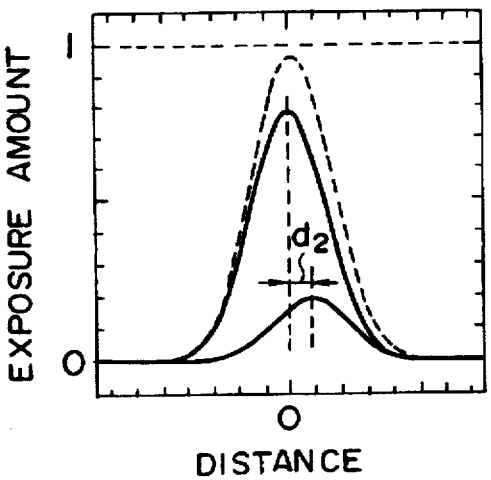
Figure 6C:
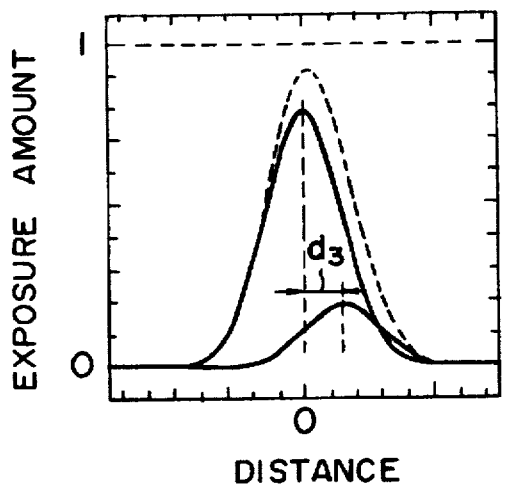
Figure 6D:
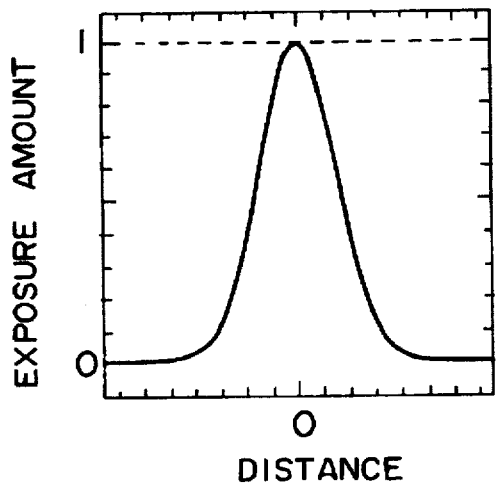

As shown in FIG. 6B or 6C, when the minimum unit moving distance of the electron beam or a distance $d_2$ or $d_3$ corresponding to an integer multiple thereof is not sufficiently smaller than the electron beam diameter, the sum of the electron beam distributions indicated by a broken line differs from that in FIG. 6D. A detailed description thereof will be omitted.

Figure 7:
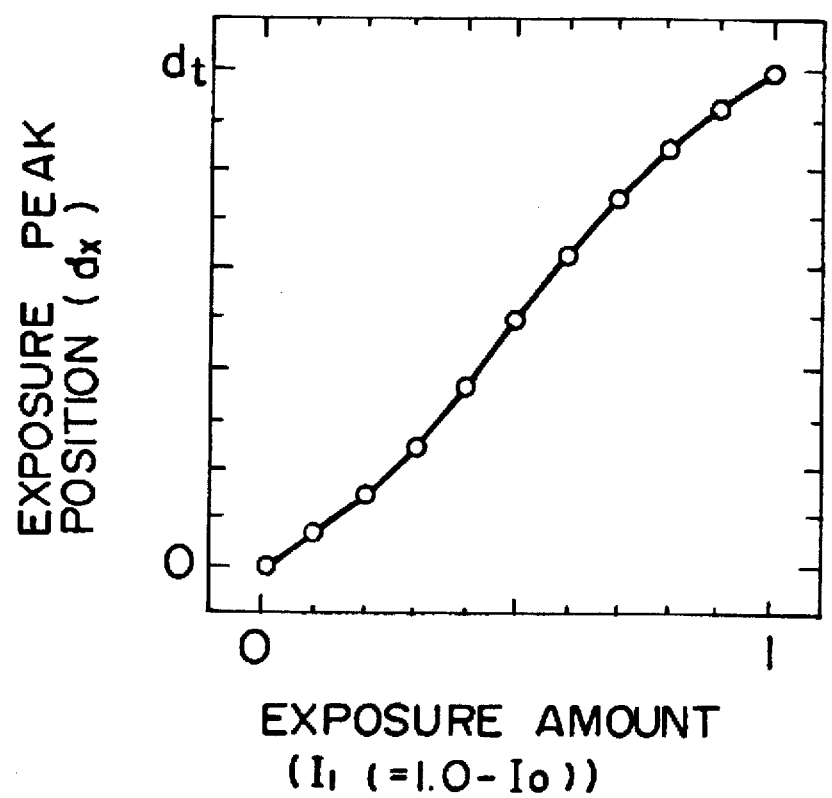
FIG. 7 is a graph showing the relationship between the exposure amount and the peak position of an electron beam in the exposure method of the present invention, which is observed when the minimum unit moving distance of the electron beam is not sufficiently smaller than the electron beam diameter.

FIG. 7 is a graph showing the relationship between the exposure amount and the exposure peak position in the sum of two electron beam distributions, which is obtained from the approximate expression of the Gaussian distribution of the electron beam in pattern formation by irradiating electron beams on two lattice points separated from each other by a distance d, in exposure amounts $I_0$ and $I_1$ $(=1.0-I_0)$, respectively, when the minimum unit moving distance of the electron beam or a distance corresponding to an integer multiple thereof is not sufficiently smaller than the electron beam diameter. When the electron beam exposure amount and the irradiation position are corrected on the basis of this calculation result, a pattern having its center at a desired position can be formed.

In the second embodiment, a pattern is formed by irradiating electron beams on two portions. Similarly, even when electron beam irradiation on three or more portions is performed, a pattern having its center at a desired position can be formed by performing similar correction.

FIGS. 8A to 8D and FIGS. 9A to 9D are views for explaining different examples of the third embodiment of the present invention, showing a technique of forming a line pattern having its center at a position other than lattice points formed for every minimum unit moving distance of an electron beam by using an electron beam exposure apparatus which sets the minimum unit moving distance of an electron beam or a distance corresponding to an integer multiple thereof smaller than the electron beam diameter.

Figure 8A:
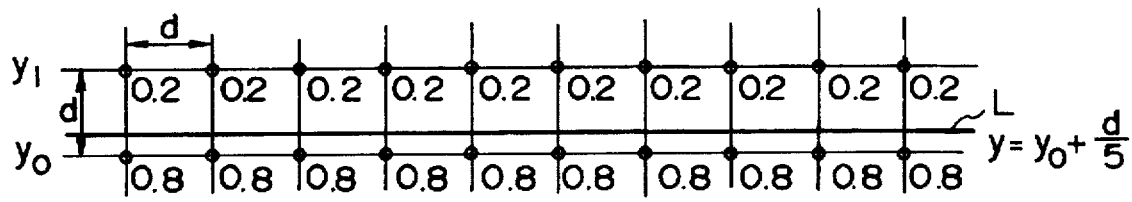
FIGS. 8A to 8D are views for explaining different examples of the third embodiment of the present invention.

FIG. 8A shows a case in which each lattice point $y=y_0$ indicated by ○ is exposed in an exposure amount of 0.8, and each lattice point $y=y_1$ parallel and adjacent to the lattice point $y_0$ and separated by the minimum unit moving distance of the electron beam or a distance d corresponding to an integer multiple thereof is exposed in an exposure amount of 0.2, where an optimum exposure amount $I_0$ of the electron beam irradiated on each lattice point in formation of a line pattern on the lattice points is defined as 1.0. The line pattern formed by this exposure method has its center position on a straight line L $(y=y_0+d/5)$ indicated by a thick solid line. Therefore, a line pattern having its center at a position other than lattice points can be obtained.

Figure 8B:
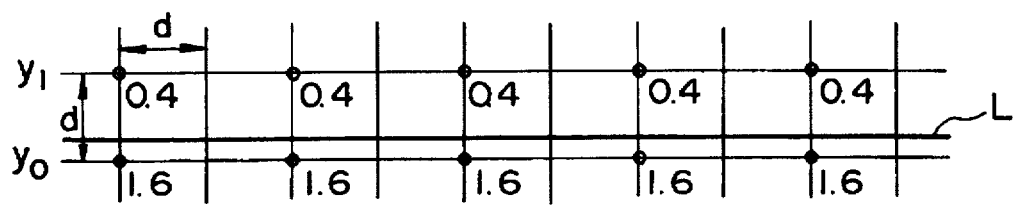
Figure 8C:
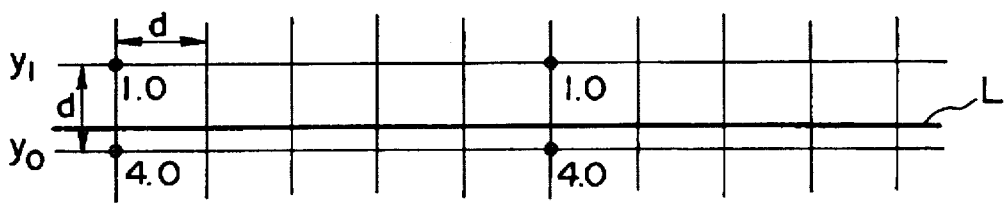
Figure 8D:
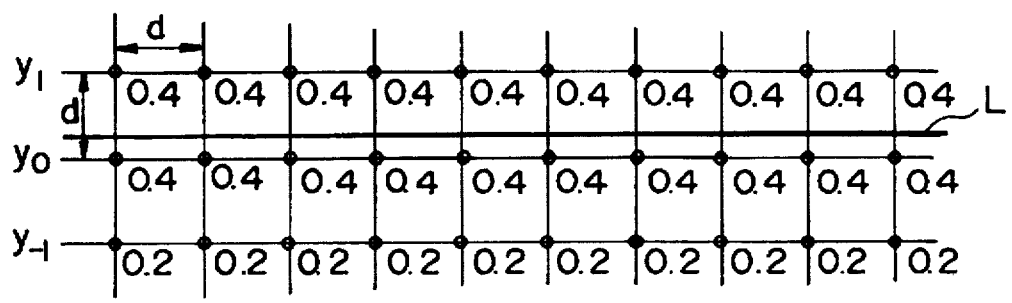

FIG. 8B shows a case in which every other lattice point $y=y_0$ or $y=y_1$ indicated by ○ is exposed in an exposure amount of 0.4 or 1.6. FIG. 8C shows a case in which every four lattice points are exposed. In both the cases, a pattern having its center at the same position as in FIG. 8A is formed. When three or more line patterns are exposed, as shown in FIG. 8D, a pattern having its center at the same position as in FIG. 8A can be formed.

Figure 9A:
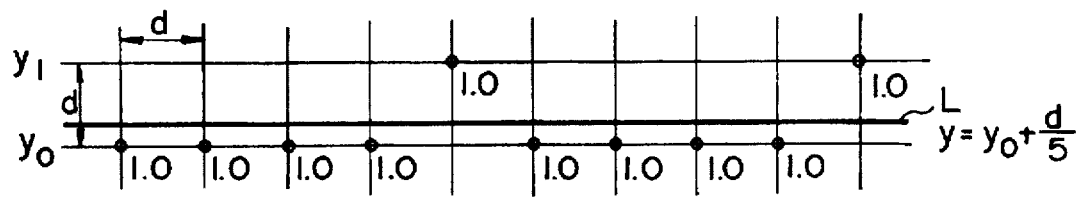
FIGS. 9A to 9D are views for explaining further different example of the third embodiment of the present invention.
Figure 9B:
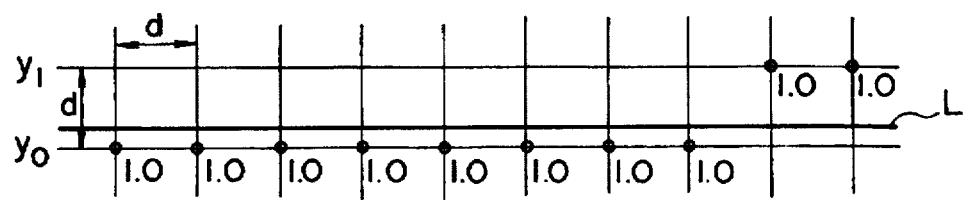
Figure 9C:
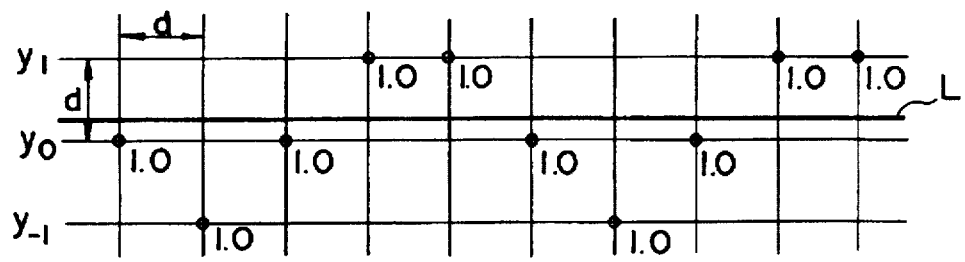
Figure 9D:
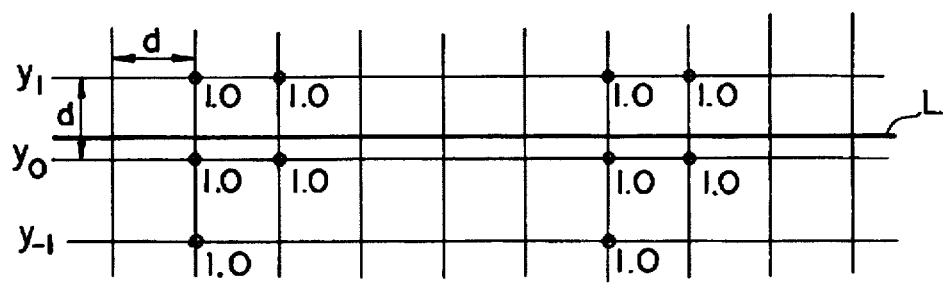

FIG. 9A shows a case in which each lattice point indicated by ○ is exposed in an exposure amount of 1.0. When a line pattern is to be formed, the influence of the proximity effect increases as compared to exposure of one point. For this reason, a pattern having its central position on the straight line L $(y=y_0+d/5)$ indicated by a thick solid line is formed, which is the same as those shown in FIGS. 8A to 8D. Similarly, in FIGS. 9B to 9D, a line pattern having its center at the same position as shown in FIGS. 8A to 8D is formed.

In each example of the third embodiment, two or more line patterns parallel to the X-axis and passing through lattice points (each line pattern is formed by irradiating electron beams on all lattice points or points periodically aligned on the lattice points) are exposed to form a pattern. When an electron beam exposure apparatus which sets the minimum unit moving distance of the electron beam or the distance d corresponding to an integer multiple thereof smaller than the electron beam diameter is used to expose N parallel line patterns at positions separated from a reference line pattern by $m_1d$, $m_2d$, . . . , and $n_Nd$ ($m_i$ is an integer) within an area having a width smaller than the electron beam diameter at intensities $P_1I_0, P_2I_0, \ldots,$ and $P_NI_0$ ($P_1+P_2+\ldots+P_N=1.0$), a line pattern having its center at a position represented by equation (2) is formed:

$$\left(\sum_{K=1}^{N} P_K m_k\right) d \quad (2)$$

In the third embodiment, a line pattern is formed. This embodiment can also be applied to form a pseudo curve pattern formed by combining straight lines.

According to the third embodiment, when the distribution of an electron beam to be irradiated is obtained from an approximate expression, and the electron beam exposure amount and the irradiation position are corrected, a line pattern can be formed at a desired position.

Figure 10:
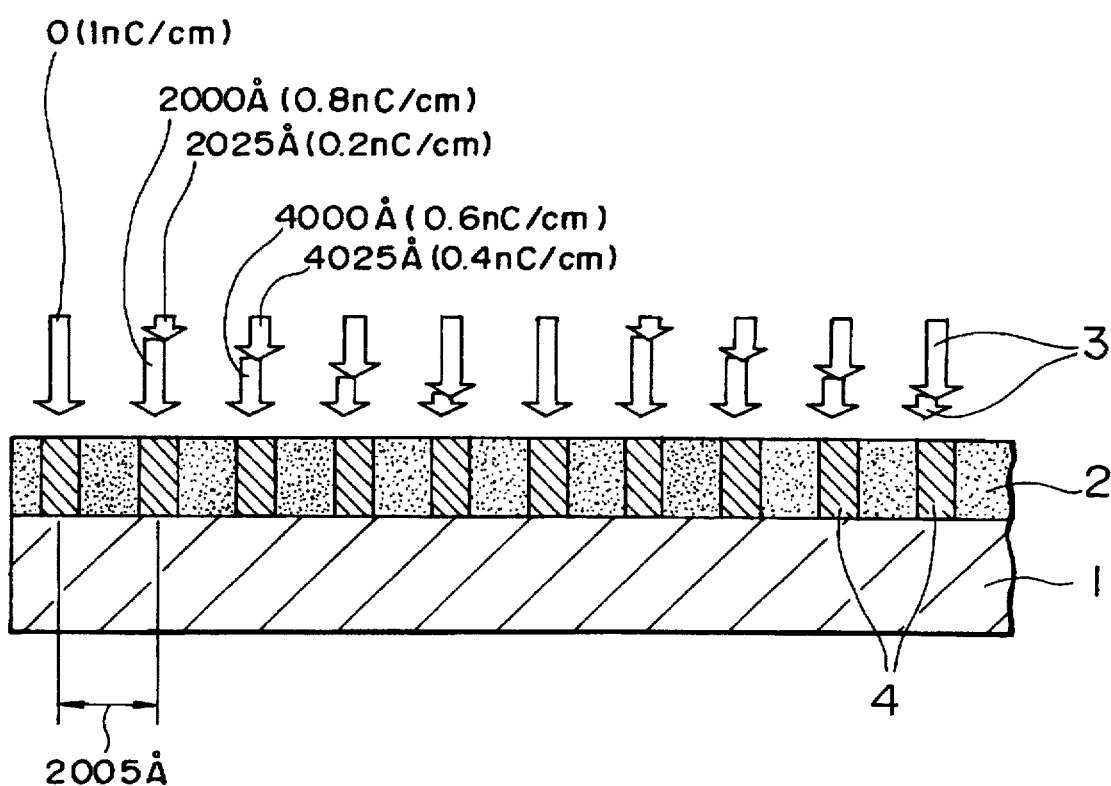
FIG. 10 is a sectional view for explaining the fourth embodiment of the present invention.

FIG. 10 is a sectional view for explaining the fourth embodiment of the present invention, showing a semiconductor substrate for manufacturing a diffraction grating so as to explain a method of controlling the diffraction grating pitch independently of the minimum unit moving distance of an electron beam of an electron beam exposure apparatus, or an integer multiple thereof. In FIG. 10, when the minimum unit moving distance of the electron beam of the electron beam exposure apparatus is 25 Å, a diffraction grating having a pitch of 2,005 Å is manufactured.

As a semiconductor substrate, an n-InP substrate is used and uniformly coated with an electron beam resist. The electron beam diameter in electron beam exposure is set at about 600 Å. A first line pattern is drawn at a reference position passing through lattice points formed for every minimum unit moving distance of the electron beam in an exposure amount of 1.0 nC/cm (optimum amount). A second line pattern is drawn by two electron beam irradiation cycles at positions shifting from the reference position by 2,000 Å and 2,025 Å in exposure amounts of 0.8 nC/cm and 0.2 nC/cm, respectively. Subsequently, line patterns are drawn at a position shifting from the first drawing position by 4,000 Å in an exposure amount of 0.6 nC/cm and at a position shifting by 4,025 Å in an exposure amount of 0.4 nC/cm. By repeating this exposure process, a diffraction grating pattern having a pitch of 2,005 Å can be formed.

When a micropattern such as a diffraction grating for a distributed feedback laser is exposed, a pattern formed by a plurality of electron beam irradiation cycles has almost the same shape as that of a pattern formed by one electron beam irradiation cycle because the influence of the proximity effect for causing an interaction between exposure patterns in the proximity becomes conspicuous due to scattering of the electron beam in the resist or reflection on the substrate surface.

Figure 11A:
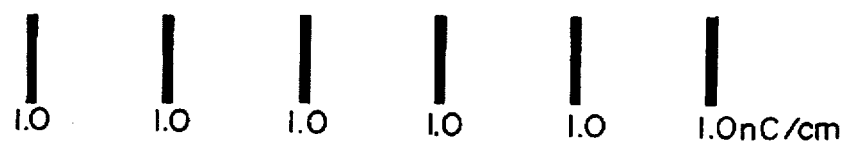
FIGS. 11A to 11F are plan views showing exposure examples in formation of a diffraction grating pattern by the exposure method shown in FIG. 10.
Figure 11B:
Figure 11C:
Figure 11D:
Figure 11E:
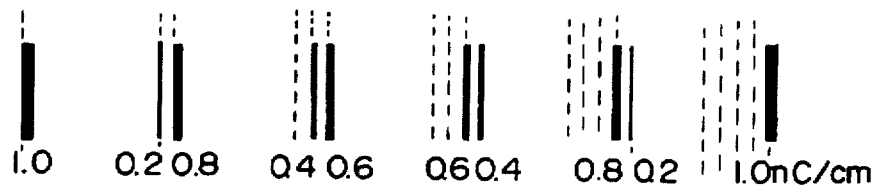
Figure 11F:
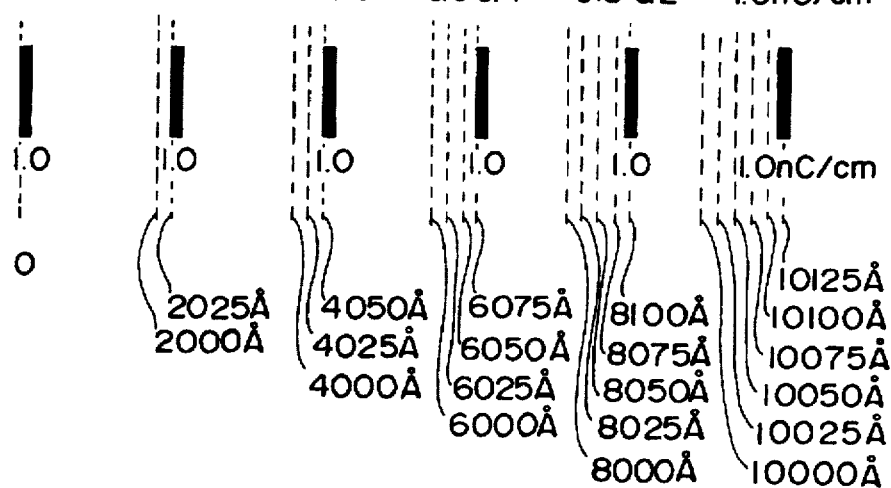

FIGS. 11A to 11F are plan views showing examples of exposure in diffraction grating pattern formation by changing the pitch in units of 5 Å from 2,000 Å to 2,025 Å and using the exposure method shown in FIG. 10. The diffraction grating patterns having pitches of 2,000 Å and 2,025 Å shown in FIGS. 11A and 11F, respectively, are formed at positions corresponding to integer multiples of the minimum unit moving distance of an electron beam of the electron beam exposure apparatus and can be formed by the normal method in which one line pattern is formed by one electron beam irradiation cycle. The diffraction grating pattern having a pitch of 2,005 Å shown in FIG. 11B is formed by the same method as in FIG. 10. The diffraction grating patterns shown in FIGS. 11C to 11E can also be formed by the same exposure method as in FIG. 11B while setting exposure positions and amounts as shown in FIGS. 11C to 11E.

More specifically, in the exposure method of the fourth embodiment, a diffraction grating is formed at a pitch $\Lambda$ (=Md+(n/N)d=(M+(n/N)d)) (M and n are positive integers: 0<(n/N)<1) corresponding to an integer multiple of 1/N (N is an integer: N≥2) of a minimum unit moving distance d of an electron beam. First, a line pattern passing through lattice points is drawn at a reference position 0 in an exposure amount of 1.0 (optimum amount). Subsequently, when a jth line pattern (2≤j≤N) is to be formed, portions separated from the reference position 0 by distances $D_{1j}d$ and $(D_{1j}+1)d$ are sequentially exposed in exposure amounts of $1-D_{2j}$ and $D_{2j}$, respectively, thereby forming a pattern having its center at a position separated from the reference position 0 by a distance $D_j$ (=(j−1)$\Lambda$=$D_{1j}d+D_{2j}d$) ($D_{1j}d$ is an integer: 0<$D_{2j}d$<1). While moving the reference position 0 by (NM+n)d, N line patterns are repeatedly exposed, thereby forming a diffraction grating pattern having a desired pitch.

Figure 12:
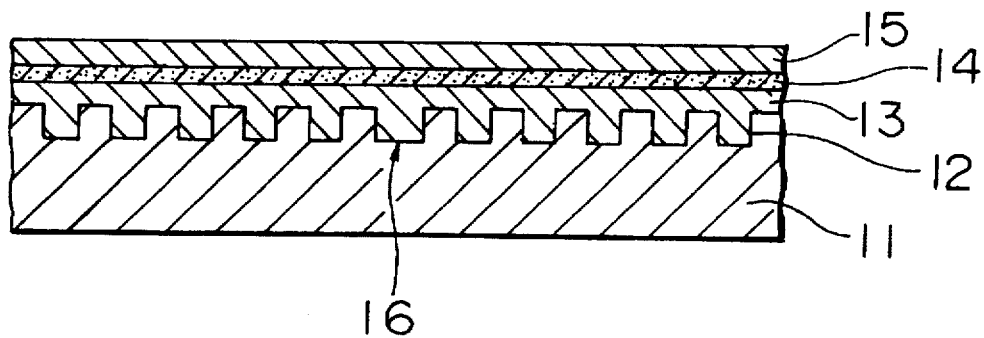
FIG. 12 is a sectional view of a λ/4-shift distributed feedback laser manufactured according to the present invention.

A distributed feedback laser having a λ/4-shifted portion 16 in an element central portion as shown in FIG. 12 was manufactured using this exposure method. A resist diffraction grating pattern was transferred onto an n-InP substrate 11 by dry etching. An n-InGaAsP optical guide layer 13, an MQW active layer 14, and a p-InP cladding layer 15 were sequentially formed on the substrate 11 having the diffraction grating 12 by MOVPE to form a double hetero-wafer having an active optical waveguide. This wafer was buried in a DC-PBH structure by LPE to form electrodes on the p- and n-side. Finally, the wafer was cut to a cavity length of 300 μm, and antireflection films were formed on the two end faces of the wafer, thereby completing the distributed feedback laser.

Figure 13:
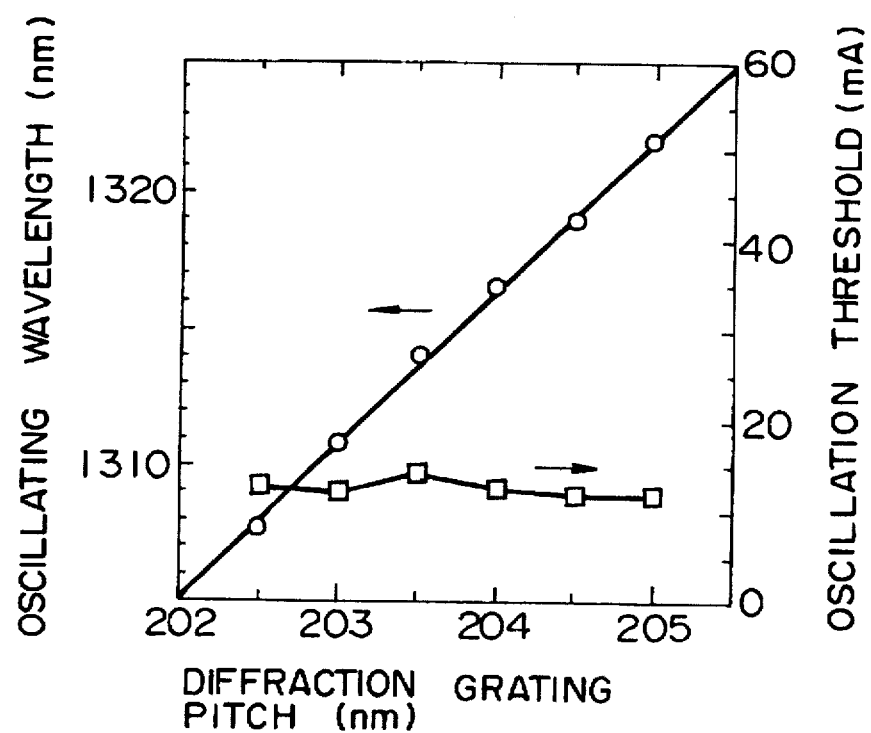
FIG. 13 is a graph showing the relationship between the diffraction grating pitch, the oscillating wavelength, and the oscillation threshold of a 6-channel wavelength multiplexing laser array according to the present invention.

FIG. 13 is a graph showing the relationship between the diffraction grating pitch, the oscillating wavelength, and the oscillation threshold of the 6-channel wavelength multiplexing laser array manufactured using the exposure method of the fourth embodiment. The oscillating wavelength between adjacent elements is controlled to an equal interval of about 3 nm. Elements having any oscillating wavelength were stably oscillated at the Bragg wavelength, and a side mode suppression rate (SMSR) of 45 dB or more was obtained. In addition, excellent characteristics such as an oscillation threshold of about 13 mA and a slope efficiency of about 0.4 W/A were obtained.

In the example shown in FIG. 12, dry etching is used. Even by wet etching, the same result as described above can be obtained, and the present invention can similarly be implemented.

In the example shown in FIG. 12, the diffraction grating 12 was formed below the active layer 14. However, the diffraction grating can also be formed above the active layer after formation of the active layer.

In the fourth embodiment, one line pattern is formed by one and two electron beam irradiation cycles. However, the line pattern can also be formed by three or more electron beam irradiation cycles. For example, as shown in FIGS. 14A to 14C, when a diffraction grating having a pitch of 2,001.667 Å is to be formed, a diffraction grating pattern having this pitch can be obtained by performing electron beam irradiation according to either of exposure methods shown in FIGS. 14A and 14B while setting exposure positions and amounts as shown in FIGS. 14A and 14B.

Figure 4C:
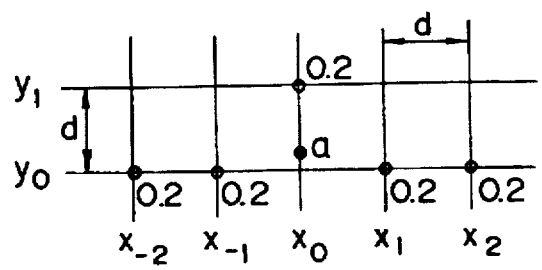
Figure 4D:
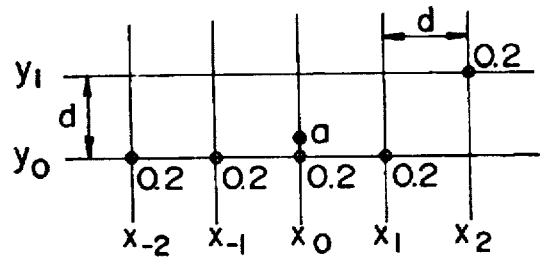

When exposure as shown in FIG. 4C is performed to form one line pattern by two electron beam irradiation cycles, a diffraction grating pattern having the same pitch as in FIGS. 14A and 14B can be obtained.

Figure 15:
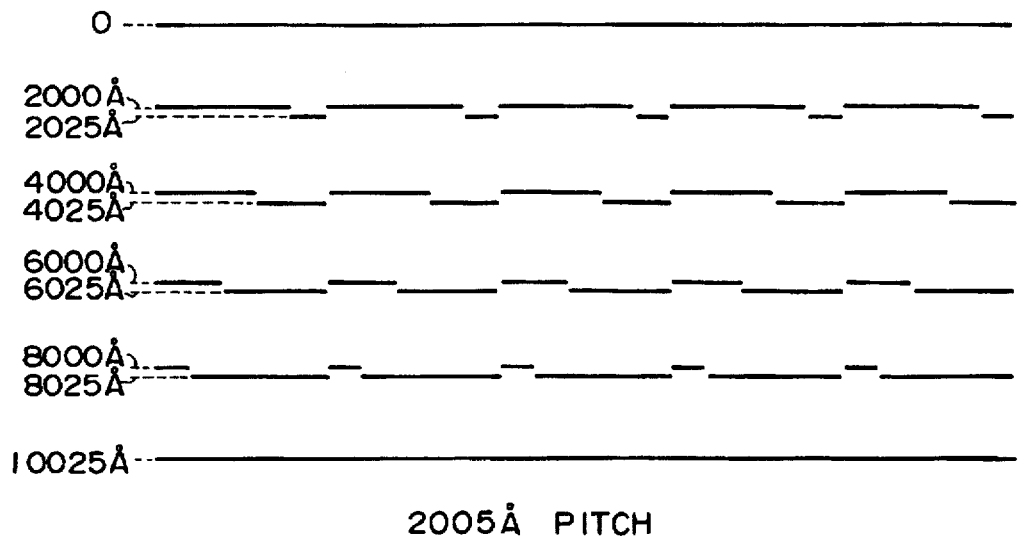
FIG. 15 is a view for explaining a technique of controlling a diffraction grating pitch according to the fifth embodiment of the present invention.

FIG. 15 is a view for explaining a method of controlling a diffraction grating pitch according to the fifth embodiment of the present invention, which shows a plan view of a semiconductor substrate for manufacturing a diffraction grating so as to explain the method of controlling the diffraction grating pitch independently of an integer multiple of the minimum unit moving distance of an electron beam of an electron beam exposure apparatus. In FIG. 15, when the minimum unit moving distance of the electron beam of the electron beam exposure apparatus is 25 Å, a diffraction grating having a pitch of 2,005 Å is manufactured.

As a semiconductor substrate, an InP substrate is used and uniformly coated with an electron beam resist. As for the exposure method, as shown in FIG. 15, a line pattern is drawn at a reference position 0 passing through lattice points formed for every minimum unit moving distance of the electron beam. Exposure is performed at positions separated from the reference position 0 by 2,000 Å and 2,025 Å in an equal exposure amount (the same exposure amount as in formation of a line pattern by one electron beam irradiation cycle) such that the ratio of line pattern lengths becomes 4:1, and the line pattern length becomes smaller than the diameter of the electron beam for forming the pattern. Subsequently, exposure is performed at positions separated from the first drawing position by 4,000 Å and 4,025 Å such that the ratio of line pattern lengths becomes 3:2. By repeating this exposure process, a diffraction grating pattern having a pitch of 2,005 Å is formed.

With the method of exposing the diffraction grating pattern according to the fifth embodiment, diffraction grating pitch control can be performed below the minimum unit moving distance of the electron beam of the electron beam exposure apparatus, as in the fourth embodiment shown in FIG. 10. Therefore, using the above exposure method, a distributed feedback laser could be manufactured with the same processes as in the fourth embodiment.

When the element formed by the above method was evaluated, the element stably oscillated at the Bragg wavelength, and a side mode suppression rate (SMSR) of 45 dB or more was obtained. In addition, excellent characteristics such as an oscillation threshold of about 15 mA and a slope efficiency of 0.4 W/A were obtained.

Figure 16:
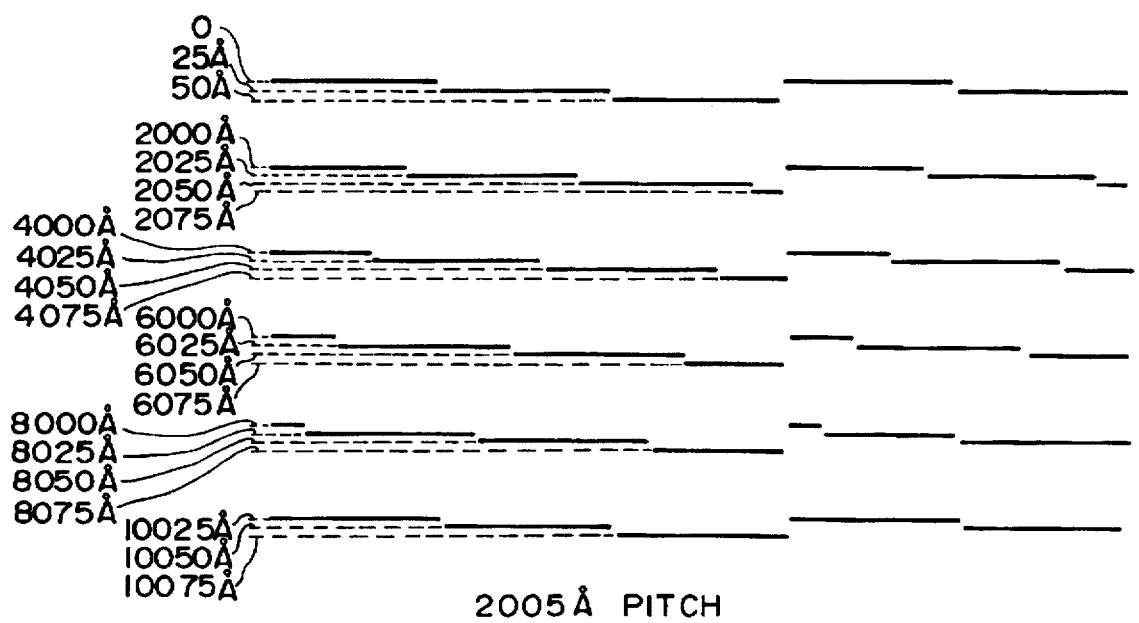
FIG. 16 is a view for explaining a modification of the fifth embodiment of the present invention.

The fifth embodiment can also be implemented when a method of combining straight lines is used, as shown in FIG. 16.

Figure 17:
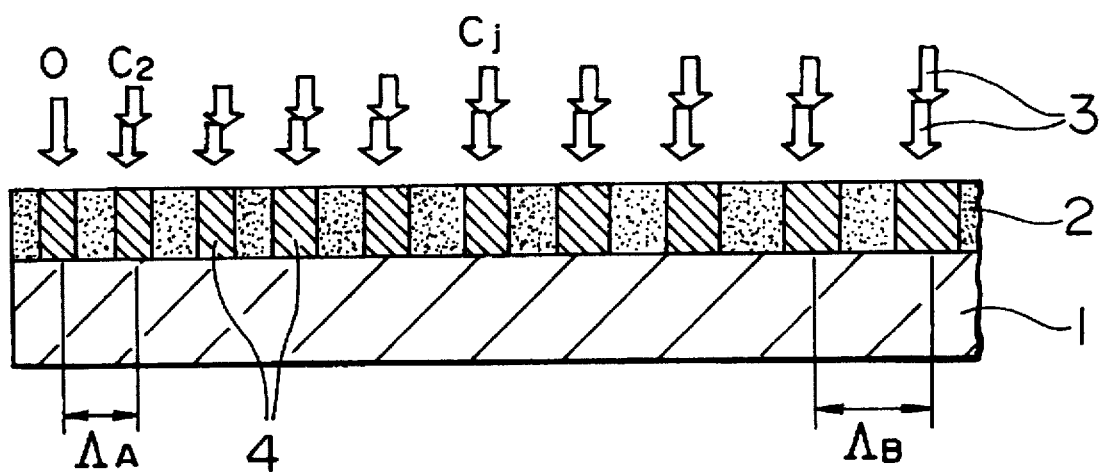
FIG. 17 is a sectional view for explaining a method of forming a pitch-modulated diffraction grating according to the sixth embodiment of the present invention.

FIG. 17 is a sectional view for explaining a method of forming a pitch-modulated diffraction grating according to the sixth embodiment of the present invention, showing a semiconductor substrate so as to explain the method of forming a pitch-modulated diffraction grating independently of an integer multiple of the minimum unit moving distance of an electron beam of an electron beam exposure apparatus.

A method of forming a pitch-modulated diffraction grating consisting of N line patterns while changing a jth pitch $\Lambda_j$ from $\Lambda_A$ to $\Lambda_B$ will be described below in accordance with equation (3):

$$\Lambda_j = \Lambda_A + (j-1)(\Lambda_B - \Lambda_A)/(N-2) \quad (3)$$

where j and N are positive integers: N>3, and $1 \leq j \leq N$.

A line pattern passing through lattice points is drawn at a reference position 0 in an exposure amount of 1.0 (optimum amount). Subsequently, a jth ($2 \leq j \leq N$) line pattern is formed. To form a pattern having its center at a position separated from the reference position 0 by a distance $D_j$ represented by equation (4), portions separated from the reference position 0 by distances $D_{1j}d$ and $(D_{1j}+1)d$ are sequentially exposed in exposure amounts of $C_j(1-D_{2j})$ and $C_j(D_{2j})$, respectively, where $C_j$ is the correction value for the exposure amount in consideration of the influence of the proximity effect for forming the optimum line width at each pitch, thereby forming a diffraction grating pattern having a desired modulated pitch:

$$D_j = \sum_{K=1}^{j-1}(\Lambda_K) = D_{1j}d + D_{2j}d \quad (4)$$

where $D_{1j}$ is a positive integer: $0 \leq D_{2j} < 1$.

In the sixth embodiment, a pattern is formed by two line patterns on lattice points adjacent to each other at an interval corresponding to the minimum unit moving distance of the electron beam. However, a pattern having its center at the same position can also be formed using two line patterns adjacent to each other at an interval corresponding to an integer multiple (twice or more) of the minimum unit moving distance of the electron beam, or using three or more line patterns.

What is claimed is:

1. A method of forming a micro dot pattern in a resist on a semiconductor substrate by using an electron beam exposure apparatus which sets a minimum unit moving distance of an electron beam smaller than an electron beam diameter, comprising the steps of:

defining one of lattice points formed for every minimum unit moving distance of the electron beam as a reference position, and irradiating the electron beam on at least to lattice points within an area separated from the reference position by a distance smaller than the electron beam diameter in an equal exposure amount or different exposure amounts to form a pattern having a center at an exposure peak position in a sum of the plurality of exposure amounts, thereby forming said micro dot pattern having a center at a position other than said lattice points.

2. A method of forming a micropattern in a resist on a semiconductor substrate by using an electron beam exposure apparatus which sets a minimum unit moving distance of an electron beam smaller than an electron beam diameter, comprising the step of irradiating the electron beam on at least two straight lines parallel to each other in areas separated from each other by a distance smaller than the electron beam and passing through lattice points formed for every minimum unit moving distance of the electron bema in an equal exposure or different exposure amounts, thereby forming a line or pseudo curve pattern having a center passing positions other than said lattice points.

3. A method of forming a micropattern in a resist on a semiconductor substrate by using an electron beam exposure apparatus which sets a minimum unit distance of an electron beam smaller than an electron beam diameter, comprising the steps of:

forming a first line pattern on lattice points serving as a reference position when a central position D of a jth line pattern for forming a diffraction grating is represented as $D=D_{1j}d+D_{2j}d$ ($D_{1j}$ is a positive integer: $0 \leq D_{2j} < 1$), and sequentially exposing straight lines passing through lattice points separated from the reference position by distances $D_{1j}d$ and $(D_{1j}+1)d$ in exposure amounts $(1-D_{2j})$ and $D_{2j}$, respectively, to form a jth ($2 \leq j$) line pattern, thereby forming a diffraction grating pattern having a pitch independently of an integer multiple of the minimum unit moving distance d of the electron beam.

* * * * *